(12) United States Patent
Ranganathan et al.

(10) Patent No.: US 7,643,803 B2
(45) Date of Patent: Jan. 5, 2010

(54) POWER ESTIMATION OF A TRANSMISSION

(75) Inventors: Thirunavukkarasu Ranganathan, Bangalore (IN); Mohamed I Iqbal, Bangalore (IN); Vijayakumaran V Nair, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 590 days.

(21) Appl. No.: 11/169,903

(22) Filed: Jun. 29, 2005

(65) Prior Publication Data
US 2007/0004349 A1 Jan. 4, 2007

(51) Int. Cl.
*H03C 1/62* (2006.01)
*H04B 17/00* (2006.01)

(52) U.S. Cl. ............... 455/115.2; 455/115.3; 455/127.1; 375/296; 375/311

(58) Field of Classification Search ............... 455/115.1, 455/115.2, 115.3, 115.4, 127.1, 127.2, 127.5, 455/129, 114.2, 117; 375/296, 297, 311, 375/312
See application file for complete search history.

(56) References Cited

U.S. PATENT DOCUMENTS

| 3,769,602 | A | * | 10/1973 | Griswold | 331/18 |
| 5,170,495 | A | * | 12/1992 | McNicol et al. | 455/116 |
| 5,193,224 | A | * | 3/1993 | McNicol et al. | 455/126 |
| 5,752,171 | A | * | 5/1998 | Akiya | 455/126 |
| 5,764,700 | A | * | 6/1998 | Makinen | 375/272 |
| 5,869,986 | A | * | 2/1999 | Haque et al. | 327/61 |
| 6,940,342 | B2 | * | 9/2005 | Ramesh et al. | 330/9 |
| 7,359,683 | B2 | * | 4/2008 | Gilberton | 455/114.3 |
| 7,463,873 | B2 | * | 12/2008 | Staszewski et al. | 455/260 |
| 2004/0152418 | A1 | * | 8/2004 | Sinha et al. | 455/42 |

* cited by examiner

*Primary Examiner*—Edward Urban
*Assistant Examiner*—Christian A Hannon
(74) *Attorney, Agent, or Firm*—Lee & Hayes, PLLC

(57) ABSTRACT

Embodiments of power estimation of a transmission are presented herein.

16 Claims, 5 Drawing Sheets

500

502
Sample an Output of a Component of an Integrated Circuit Configured to Amplify and Transmit a Signal for Wireless Communication

504
Estimate Power of the Signal based on the Sample by One or More Other Components of the Integrated Circuit

506
Manage the Transmission Power of the Signal based on the Estimate

*Fig. 5*

POWER ESTIMATION OF A TRANSMISSION

BACKGROUND

The use of wireless and wired communication is ever increasing. For example, a consumer may utilize a wireless phone to communicate using voice and data. The consumer may also use a wireless laptop to access a wireless network to send and receive email and instant messages. Further, to interact with the laptop, the consumer may employ wireless devices, such as a wireless keyboard and mouse, a wireless printer, and so on. Thus, a wide variety of devices may communicate using wireless techniques, one to another.

The transmission power of these devices may be monitored for compliance with a variety of factors. For example, the transmission power of a wireless device may be monitored to determine whether the device is operating as intended. Is the device operating at or near its peak power level? Is the transmission power maximizing the capabilities of the device? Further, wireless transmission power may be required to remain under a stipulated emission level as prescribed by respective wireless standards. For instance, the Federal Communication Commission (FCC) may specify an average power limit over a particular amount of time that may be utilized by the wireless device.

Traditional techniques which are utilized to monitor transmission power, however, may affect the transmission power itself, may be difficult to calibrate, and may require additional devices which may further increase the complexity and cost of the wireless device. For example, traditional techniques require passive components that result in a power overhead, which may affect the operation of the power amplifier itself. Also, calibration for the bond wire may introduce resistance offsets for monitoring the drop due to current variation.

BRIEF DESCRIPTION OF THE DRAWINGS

FIG. 1 shows multiple wireless devices, each equipped with a wireless integrated circuit.

FIG. 5 is a flow diagram depicting a procedure in an exemplary implementation in which a power transmission estimation of an output of a component of an integrated circuit is made by another component on the integrated circuit from a sample taken from the output.

The same reference numbers are utilized in instances in the discussion to reference like structures and components.

DETAILED DESCRIPTION

Estimation and management techniques for power transmission are described. In the following discussion, exemplary devices are first described which are operable to employ estimation and management techniques. Exemplary procedures are then described which may be performed utilizing the exemplary devices, as well as by other devices.

Exemplary Devices

Figure 1:
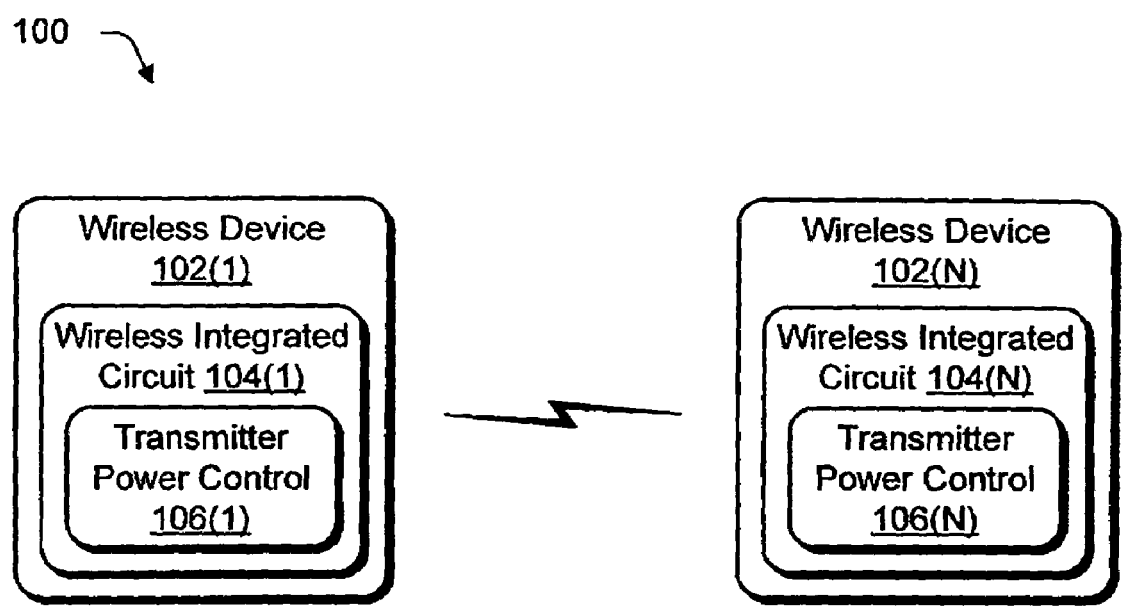
FIG. 1 is an illustration of an environment in an exemplary implementation that is operable to employ techniques for detecting power of a transmission.

FIG. 1 illustrates an environment 100 in an exemplary implementation that is operable to employ techniques for estimating power of a transmission. It should be noted that although the environment 100 of FIG. 1 describes wireless transmission, wired transmission may also be employed. The environment 100 includes a plurality of wireless devices 102 (1), . . ., 102(N) which may be configured in a variety of ways. For example, the wireless devices 102(1)-102(N) may be configured as wireless phones, wireless routers, computing devices which are capable of wireless communication, peripheral devices (e.g., wireless mouse, keyboard, and so on), and so on.

Each of the wireless devices 102(1)-102(N) is illustrated as having a respective wireless integrated circuit 104(1)-104 (N). The wireless integrated circuits 104(1)-104(N) may be formed in a variety of ways. For example, each of the wireless integrated circuits 104(1)-104(N) may be formed as a single complementary metal-oxide semiconductor device (CMOS) (or other integrated circuit process such as SiGe) that is configured to provide wireless communication, e.g., transmission and/or reception of wireless signals.

The wireless integrated circuits 104(1)-104(N) are further illustrated as including a respective transmitter power control 106(1)-106(N). In the illustrated implementation, the transmitter power controls 106(1)-106(N) are illustrated as within the wireless integrated circuit 104(1)-104(N) to indicate that the respective transmitter power controls 106(1)-106(N) may be provided "on chip" in the wireless integrated circuits 104 (1)-104(N), such as within a single CMOS integrated circuit. In this embodiment, off-chip components are not needed to detect the power of a transmission from the wireless integrated circuits 104(1)-104(N) and therefore do not significantly affect the output of the transmission from the respective wireless integrated circuits 104(1)-104(N).

Figure 2:
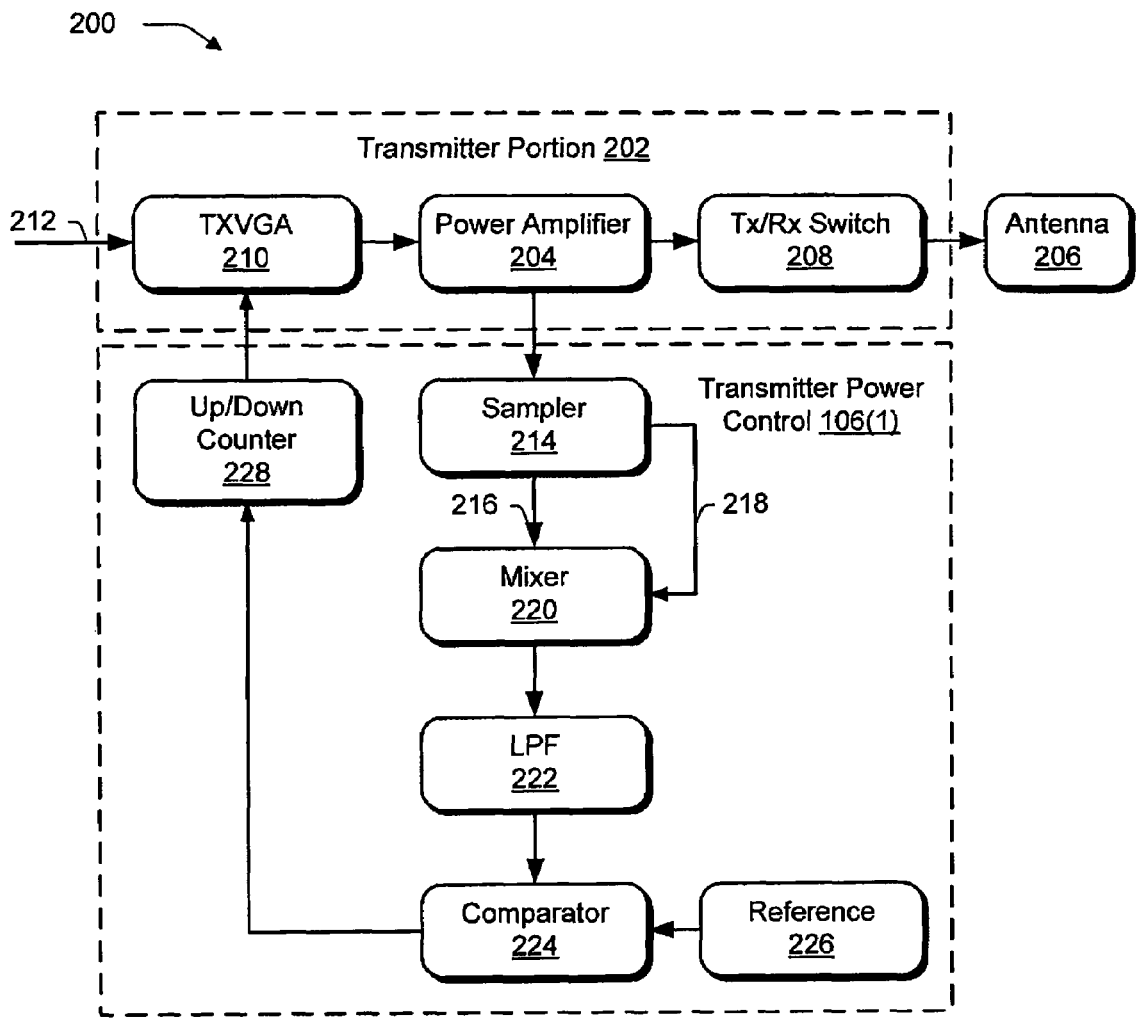
FIG. 2 is an illustration of an exemplary implementation showing a portion of the wireless integrated circuit of FIG. 1 in greater detail as employing a mean square technique for estimating transmitter power.

FIG. 2 illustrates an exemplary implementation showing a circuit 200 included in the wireless integrated circuit 104(1) of FIG. 1 in greater detail as employing a root mean square technique for estimating transmitter power. Portions of the circuit 200 may be included in a variety of wireless integrated circuits 104(1), such as an analog front end chip. The circuit 200 is further illustrated as including a transmitter portion 202 and the transmitter power control 106(1) of FIG. 1.

The transmitter portion 202 includes a power amplifier 204 communicatively coupled to an antenna 206 through a transmitter/receiver switch, which is illustrated as "TX/RX switch" 208 in FIG. 2, although a variety of other devices may also be utilized, such as a duplex filter. Although a single antenna 206 is illustrated, the antenna 206 may be representative of a plurality of antennas, such as in a multiple input, multiple output (MIMO) scenario. The power amplifier 204 may thus deliver power to the antenna 206 for transmission of a communication received as an input 212 at the TXVGA 210. For example, a base-band band analog input may be received and amplified by the power amplifier 204 for transmission using the antenna 206.

To control the transmission power, the circuit 200 also includes a transmitter power control 106(1) as previously described in FIG. 1. The transmitter power control 106(1) measures the transmitter power output by "tapping" the output of power amplifier 204 through use of a sampler 214, tapping output of switch 208, and so on. The sampler 214 may sample the power amplifier 204 without significantly disturbing the transmitter output impedance. For example, the sampler 214 may utilize a sub-sampling technique such that it operates at a frequency (e.g., 2 MHz) that is significantly lower than a radio frequency (e.g., 3-5 GHz) utilized by the power amplifier 204. For example, components that operate using reduced amounts of power may be employed which may further preserve the integrity of the signal and reduce complexity of the semiconductor device. It should be noted that these techniques are also applicable to nonlinear modulation systems, such as orthogonal frequency division multiplexing (OFDM) and so on.

The sampler 214 is illustrated as providing two outputs 216, 218 to a mixer 220. In an implementation, the mixer 220 is "re-used" from a receiver mixer that is typically present in a receive path of transceiver schemes. For instance, the wireless integrated circuit 104(1) may be configured to include a receiver variable gain amplifier that includes the mixer 220. Thus, the mixer 220 may be used by the receive path of the wireless integrated circuit 104(1) and in conjunction with the transmitter power control 106(1), thereby conserving space and resources of the wireless integrated circuit 104(1). The two outputs 216, 218 provided by the sampler 214 to the mixer 220 may be the same, i.e., the inputs match.

The output of the mixer 220 represents a measure of transmitter power. For example, the mixer 220 and LPF 222 may employ a mean square technique for calculating the measure of transmitter power, further discussion of which may be found in relation to FIG. 3.

An output of the mixer 220 is provided to a low pass filter 222 (LPF), which may be implemented in a variety of ways, such as through a switched capacitor scheme to reduce an area utilized by the LPF 222 of the wireless integrated circuit 104(1). The output of the LPF 222 is an estimate of transmitter power, which may then be provided to a comparator 224. The comparator 224 may compare this output with a reference 226 (e.g., a band gap reference) to determine whether the power amplifier 204 is providing transmitter power as intended. For example, the band gap reference may specify a maximum average power limit over a specified duration. The FCC, for instance, may specify an average power limit over a duration of one millisecond and therefore the reference 226 may correspond to this limit over this duration.

The output from the comparator 224 may be utilized to give up/down control to an up/down counter 228 for control of transmission amplitude. For example, the up/down counter 228 may be implemented by a capacitor which is "cleared" at the end of each duration specified by an applicable wireless standard. Thus, the up/down counter 228 may give up/down control to a variable gain amplifier for closed loop control of transmitter amplitude.

Figure 3:
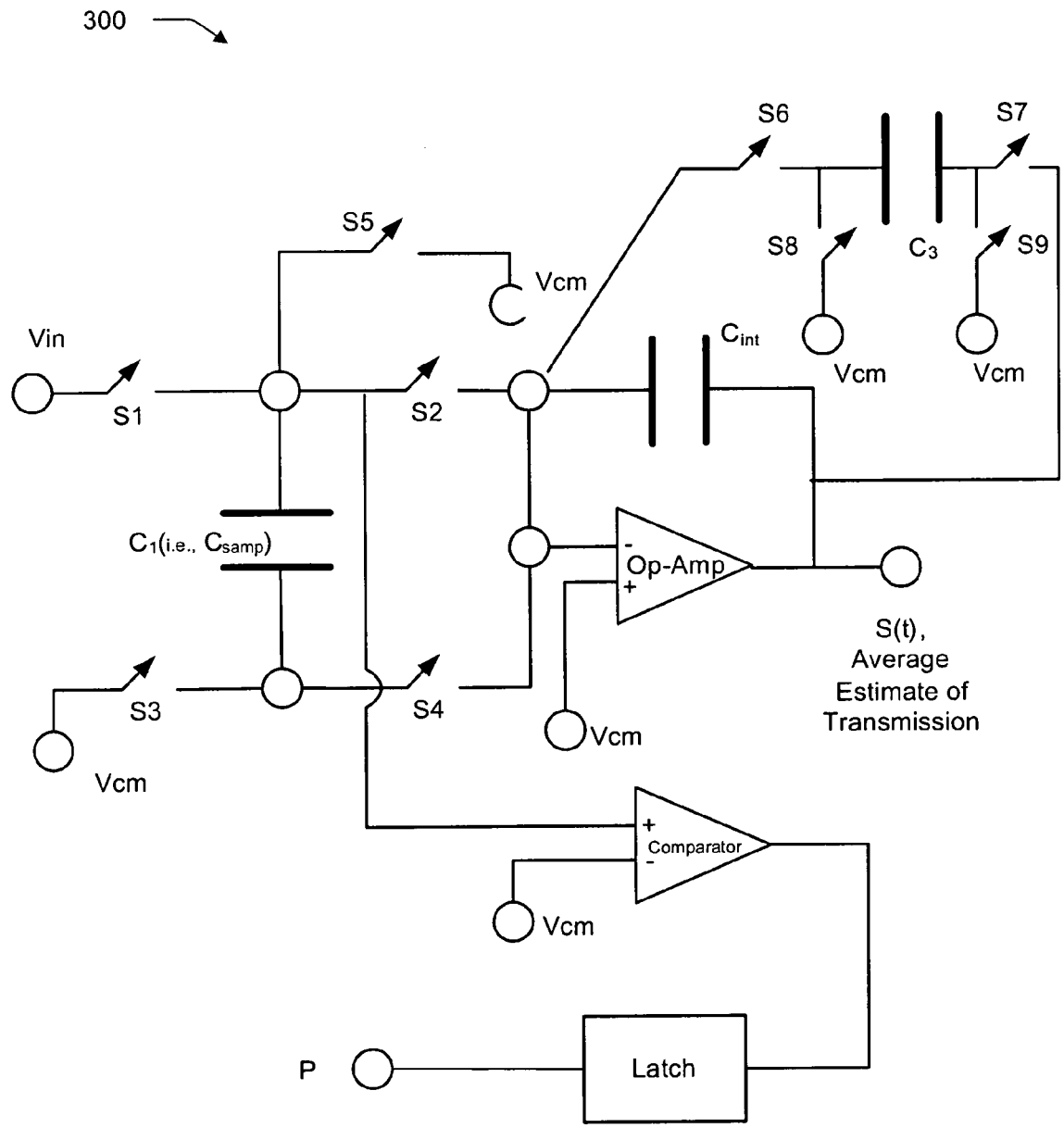
FIG. 3 is an illustration of another exemplary implementation showing a portion of the wireless integrated circuit of FIG. 1 in greater detail as employing a mean of absolute technique for estimating transmitter power.

FIG. 3 illustrates another exemplary implementation showing a circuit 300 of the wireless integrated circuit 104(1) of FIG. 1 in greater detail as employing a mean of absolute technique for estimating transmitter power. In the circuit 300 of FIG. 3, switches are represented by the letter "S"; capacitors are represented as "$C_1$", "$C_2$" and "$C_3$"; and "Vcm" represents common mode voltage. The mean-absolute technique, when implemented, may operate in close agreement with the mean-square techniques previously described through use of the mixer 220 of FIG. 2.

In the circuit 300 of FIG. 3, polarity of the sampled signal is tracked at every sampled instant by a comparator to produce a polarity flag. The polarity flag is indicative of whether the signal is above or below the common mode level (Vcm). In an implementation, the polarity flag may further be utilized to control the switches of a switched capacitor integrator such that absolute values of the samples are integrated for a predetermined duration, such as for compliance with FCC specifications. It should be noted that the polarity of the input sample is asserted after then input is sampled and stored in the input capacitor "$C_{samp}$".

The circuit may be implemented in the following sequence. During a sampling phase, switches "S1" and "S3" are closed, while the other switches S2 and S4 are open. Therefore, the comparator finds a sign of the signal amplitude and produces flag "P". In a subsequent phase, depending on P either S4 and S5 are closed and S1, S2, S3 are opened, or S2 and S3 are closed and S1, S4, S5 are opened, This causes a charge stored on capacitor "C1" to be fed into the op-amp for averaging process by low pass filter action of the op-amp circuit that includes the op-amp, the capacitor and the switches "S6", "S7", "S8" and "S9", a result of which is an absolute average estimate of transmission "S(t)". These phases may then be repeated to obtain additional estimations. Thus, where "$\Phi_{s1}$", "$\Phi_{s2}$", "$\Phi_{s3}$" and "$\Phi_{s5}$" are respective clocks for switches "S1", "S2", "S3" and "S5", the following Boolean relations hold true for FIG. 3

$$\Phi_{s3} = \Phi_{s1} + \Phi_{s2} \cdot P$$

$$\Phi_{s5} = \Phi_{s4} P_{bar}$$

It may be noted that switched capacitor circuit in FIG. 3 is a simplified example of a circuit arrangement with which the absolute value of a voltage signal with respect to a common mode signal may be low pass filtered to produce a DC average with respect to the same common mode signal. Other, more complex circuit schemes may also be used to achieve the same objective without departing from the spirit and scope thereof.

As is shown in FIG. 3, a square operation is not utilized through use of the illustrated switched-capacitor scheme and therefore the mixer 220 of FIG. 2 is not required. In this way, the area utilized in the transmitter power control 106(1) may have a reduced area, thereby conserving resources and reducing costs.

Figure 4:
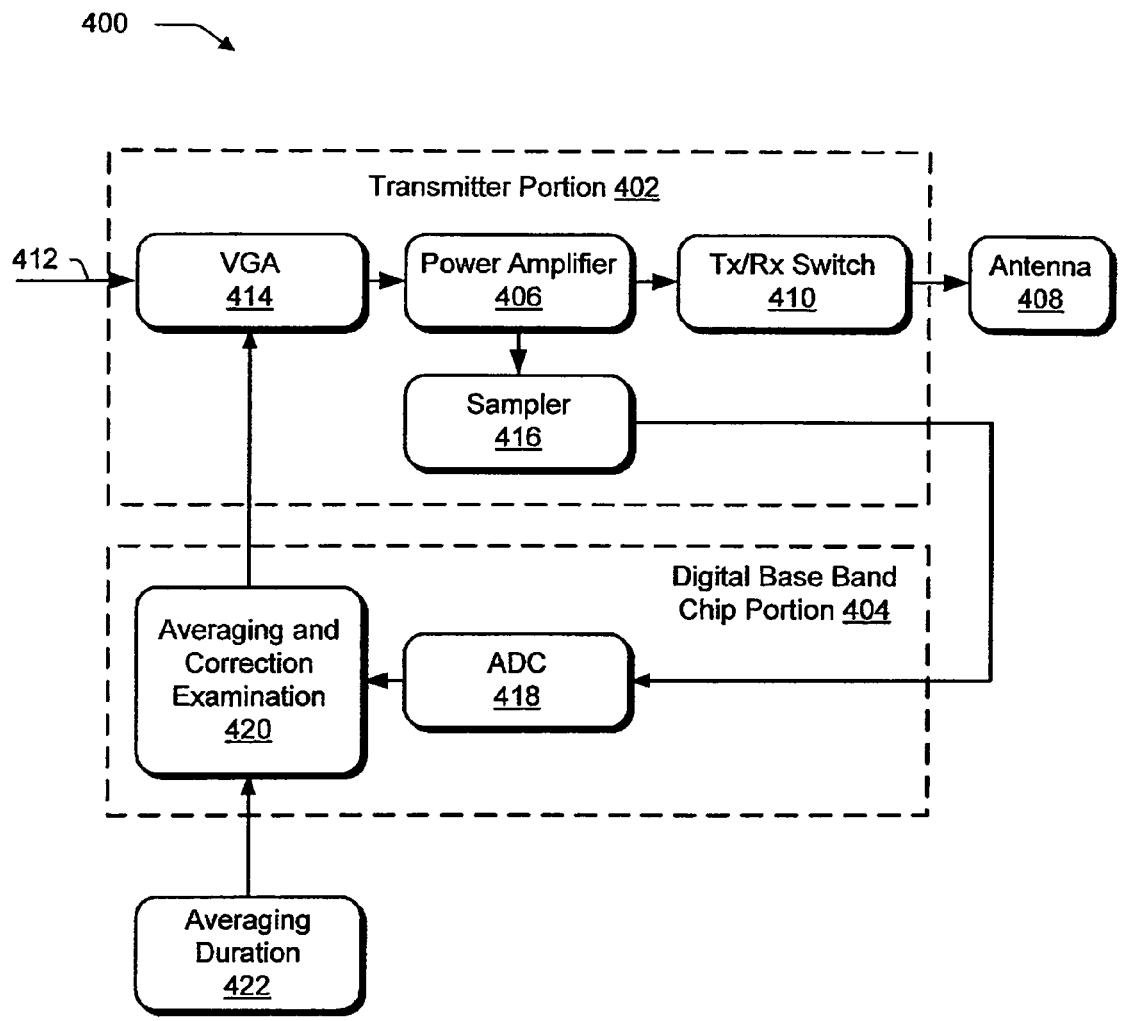
FIG. 4 is an illustration of an exemplary implementation showing a portion of the wireless integrated circuit of FIG. 1 in greater detail as employing a digital technique for estimating transmitter power.

FIG. 4 illustrates a circuit 400 included in the wireless integrated circuit 104(1) of FIG. 1 in greater detail as employing a digital technique for estimating transmitter power and therefore provide the transmitter power control 106 of FIG. 1. The circuit 400 includes a transmitter portion 402 and a digital base band chip portion 404. The transmitter portion 402 may configured as part of an analog front end chip. The transmitter portion 402 includes a power amplifier 406 communicatively coupled to an antenna 408 through a transmitter/receiver switch, which is illustrated as "TX/RX switch" 410 in FIG. 4. As before, the power amplifier 406 may thus deliver power to the antenna 408 for transmission of an input 412, which in this example is received at a variable gain amplifier (VGA) 414.

The power amplifier is "tapped" by a sampler 416 as previously described. In this embodiment, however, the sampler 416 is included in the transmitter portion 402 of the circuit 400 of the wireless integrated circuit 104(1). An output of the sampler is provided from the transmitter portion 402 to an analog/digital converter (ADC) 418 included in the digital based band chip portion 404. In an implementation, the ADC 418 is "re-used" from a receiver section of a transceiver. For example, the ADC 418 may be part of the receiver section, but operate at a significantly lower sampling rate, such as 2 MHz versus 528 MHz in the case of an ultra-wideband implementation.

The output of the ADC 418 is provided to an averaging and correction examination circuit 420. As previously stated, the mean-absolute and root-mean-square techniques of sampled signals are in close agreement. Therefore, the digital implementation may adapt to a simple averaging scheme instead of using a square root realization, although such a realization may also be employed without departing from the spirit and scope thereof. Once the average power estimate is determined for an averaging duration 422, a correction step may be computed and provided to the VGA 414 to bring the transmitter amplitude to a desired set value. As should be apparent from FIG. 4, this implementation may utilize digital devices for computing an average estimation of transmitter power instead of utilizing analog components.

Exemplary Procedures

The following discussion describes power detection and management techniques that may be implemented utilizing the previously described systems and devices, as well as in other systems and devices. Aspects of the procedures may also be implemented in hardware, firmware, or software, or a combination thereof. The procedures are shown as a set of blocks that specify operations performed by one or more devices and are not necessarily limited to the orders shown for performing the operations by the respective blocks. In portions of the following discussion, reference will be made to the devices and components of FIGS. 1-4.

FIG. 5 is a flow diagram depicting a procedure 500 in an exemplary implementation in which a power transmission estimation of an output of a component of an integrated circuit is made by another component on the integrated circuit from a sample taken from the output. An output is sampled of a component of an integrated circuit configured to amplify and transmit a signal for wireless communication (block 502). For example, the sampler 214 may "tap" an output of the power amplifier 204 at a frequency that is significantly lower than a frequency of a signal being amplified by the power amplifier 204.

An estimation of the power of the signal is made based on the sample by one or more other components of the integrated circuit (block 504). For example, the mixer 220 of FIG. 2 may make an estimation utilizing a mean square root technique. In another example, the switched capacitor integrator of FIG. 3 may utilize a mean of absolute technique to estimate power of the transmission. In a further example, digital components (e.g., averaging and correction examination 420 of FIG. 4) may be utilized to estimated power of the transmission using an averaging technique. A variety of other examples are also contemplated.

The transmission power of the signal is then managed based on the estimate (block 506). For example, the estimate of the transmission power may be provided as an input to a comparator 224. The comparator 224 may then compare the input (i.e., the estimate) to a reference 226. The reference 226 may be configured in a variety of ways, such as a desired operational range, a limit prescribed by a wireless communication standard (e.g., standards imposed by the FCC), and so on. Based on the comparison, a variable gain amplifier may be adjusted accordingly, such as to decrease or increase the transmission power.

In another example, a switched capacitor integrator of FIG. 3 may provide an average estimation of emission. This estimation may also be utilized to vary gain of an amplifier, and manage transmission power accordingly. In a further example, the averaging and correction examination 420 component of FIG. 4 may estimate transmission power of the power amplifier 406 and calculate a correction to be applied to the variable gain amplifier 414. A variety of other examples are also contemplated to manage transmission power on a single integrated circuit.

CONCLUSION

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. An integrated circuit comprising:
   a transmitter portion configured to transmit a signal; and
   a transmitter power control configured to estimate power of the signal, wherein the transmitter power control utilizes:
   a sampler that utilizes a sub-sampling technique to tap a voltage output of a power amplifier included in the transmitter portion and operates at a frequency that is significantly lower than a frequency, at which, the power amplifier operates; and
   a mixer to estimate power of the signal;
   a low pass filter (LPF), wherein the LPF utilizes a switched capacitor scheme to estimate power of the wireless signal;
   a comparator, wherein the comparator compares an output of the LPF to a band gap reference;
   an up/down counter;
   a receiver configured to receive a wireless signal and wherein operation of the mixer is shared by the receiver; and
   wherein the transmitter power control employs an averaging technique to estimate power of the signal, wherein the averaging technique utilizes an absolute value of a voltage signal with respect to a common mode signal to produce a DC average to the common mode signal.

2. An integrated circuit as described in claim 1, wherein the transmitter portion and the transmitter power control are formed using a complementary metal-oxide semiconductor device (CMOS).

3. An integrated circuit as described in claim 1, wherein the transmitter power control is further configured to manage transmission power of the signal.

4. An integrated circuit as described in claim 1, wherein the mixer employs a mean-square technique to estimate power of the wireless signal.

5. An integrated circuit as described in claim 1, wherein the transmitter power control utilizes digital processing to estimate power of the signal.

6. An integrated circuit as described in claim 1, wherein the transmitter power control employs a mean of absolute value technique to estimate power of the signal.

7. A system comprising:
   an antenna; and
   an integrated circuit having:
   a power amplifier configured to amplify a signal for wireless transmission;
   a sampler configured to sample the signal, wherein a frequency of the sampler utilized to sample the output is significantly lower than a frequency of the power amplifier;
   a low pass filter (LPF), wherein the LPF utilizes a switched capacitor scheme to estimate power of the wireless signal;
   a comparator, wherein the comparator compares an output of the LPF to a band gap reference;
   an up/down counter, wherein the up/down counter is implemented utilizing a capacitor which is cleared at an end of a duration specified by a wireless standard; and a mixer configured to estimate power of the signal based on the sample, wherein the mixer is also utilized in a receiver included on the integrated circuit.

8. A system as described in claim 7, wherein the mixer employs a mean-square technique to estimate power of the signal.

9. A system as described in claim 7, wherein the power amplifier, the sampler, the mixer, the low pass filter, the comparator, and the up/down counter are formed using a complementary metal-oxide semiconductor device (CMOS).

10. A system as described in claim 7 embodied in a wireless phone, wireless router, computing device or peripheral device.

11. A method comprising operating a single integrated circuit to:
   sample an output of a component of the single integrated circuit, wherein the component is configured to amplify a signal to be transmitted; and
   estimate power of the signal based on the sample, wherein the estimation is performed using a mixer, the operation of which is shared by a receiver of the single integrated circuit
   wherein the single integrated circuit includes:
      a power amplifier; and
      a sampler to sample the wireless signal;
      a comparator to produce indications of a relationship of the wireless signal
   to a common mode level;
      an up/down counter, wherein the up/down counter is implemented utilizing a capacitor which is cleared at an end of a duration specified by a wireless standard; and
      a device to provide the estimate, which is an average estimate of transmission power of the signal, wherein one or more switches of the device are controlled based on the indications.

12. A method as described in claim 11, wherein the estimation is performed using a mean-square technique.

13. A method as described in claim 11, wherein the estimation is performed using digital processing.

14. A method as described in claim 11, wherein the estimation is performed using a mean of absolute value technique.

15. A method as described in claim 11, wherein the operating of the single integrated circuit includes managing transmission power of the signal based on the estimate.

16. A method as described in claim 15, wherein the managing includes managing gain of a variable gain amplifier of the single integrated circuit.

* * * * *